US012700715B2

(12) United States Patent
Abellan et al.

(10) Patent No.: US 12,700,715 B2
(45) Date of Patent: Aug. 4, 2026

(54) RANDOM NUMBER GENERATOR COMPRISING A VERTICAL CAVITY SURFACE EMITTING LASER

(71) Applicant: QUSIDE TECHNOLOGIES S.L., Barcelona (ES)

(72) Inventors: Carlos Abellan, Barcelona (ES); Waldimar Amaya, Barcelona (ES); Domenico Tulli, Barcelona (ES); Miquel Rudé, Barcelona (ES)

(73) Assignee: QUSIDE TECHNOLOGIES S.L., Barcelona (ES)

( * ) Notice: Subject to any disclaimer, the term of this patent is extended or adjusted under 35 U.S.C. 154(b) by 557 days.

(21) Appl. No.: 18/363,019

(22) Filed: Aug. 1, 2023

(65) Prior Publication Data

US 2023/0387660 A1 Nov. 30, 2023

Related U.S. Application Data

(63) Continuation of application No. PCT/EP2022/052221, filed on Jan. 31, 2022.

(30) Foreign Application Priority Data

Feb. 1, 2021 (EP) ..................................... 21382083

(51) Int. Cl.
*H01S 5/062* (2006.01)
*G06F 7/58* (2006.01)
*H01S 5/183* (2006.01)

(52) U.S. Cl.
CPC .......... *H01S 5/06213* (2013.01); *G06F 7/588* (2013.01); *H01S 5/183* (2013.01)

(58) Field of Classification Search
CPC ......... H01S 5/06213; H01S 5/183–185; G06F 7/588
See application file for complete search history.

(56) References Cited

U.S. PATENT DOCUMENTS 11,631,964 B2 * 4/2023 Pruneri ................. H01S 5/0427
708/250
2013/0036145 A1 * 2/2013 Pruneri ................... G06F 7/588
708/250
(Continued)

FOREIGN PATENT DOCUMENTS

CN 106301754 A 1/2017
EP 3709456 A1 9/2020
(Continued)

OTHER PUBLICATIONS

Translation of CN 106301754A.*
International Search Report, PCT/EP2022/052221, Apr. 7, 2022, 3 pages.

*Primary Examiner* — James A Menefee
(74) *Attorney, Agent, or Firm* — Edell, Shapiro & Finnan, LLC

(57) ABSTRACT

Provided for herein is random number generator that includes a vertical cavity surface emitting laser, VCSEL, a mode separator and a photodetector, the random number generator further comprising a power source to drive the VCSEL in direct modulation mode. The VCSEL is adapted to emit, from an emitting section into space outside of a VCSEL cavity, laser light with two distinct laser modes of random relative strength that can propagate in a propagation direction away from the emitting section. The mode separator is arranged between the photodetector and the VCSEL in propagation direction to separate the two distinct laser modes from each other and to transmit one of the distinct laser modes to the photodetector.

18 Claims, 3 Drawing Sheets

(56) References Cited

U.S. PATENT DOCUMENTS

| | | | | |
|---|---|---|---|---|
| 2015/0331672 A1* | 11/2015 | Yuan | .................... | H04L 9/0852 |
| | | | | 359/107 |
| 2016/0259625 A1* | 9/2016 | Scarlett | ................ | H04L 9/0852 |
| 2017/0115960 A1* | 4/2017 | Pruneri | ................ | H01S 3/1106 |
| 2022/0043634 A1* | 2/2022 | Abellan | ................... | G06F 7/02 |

FOREIGN PATENT DOCUMENTS

| | | | | | |
|---|---|---|---|---|---|
| GB | 2582311 A | * | 9/2020 | .............. | H01S 5/12 |
| WO | WO-2021198543 A1 | * | 10/2021 | .............. | G06F 7/58 |

* cited by examiner

RANDOM NUMBER GENERATOR COMPRISING A VERTICAL CAVITY SURFACE EMITTING LASER

CROSS REFERENCE TO RELATED APPLICATIONS

This is a Continuation of International Application PCT/EP2022/052221 which has an international filing date Jan. 31, 2022, and the disclosure of which is incorporated in its entirety into the present Continuation by reference. This Continuation also claims foreign priority under 35 U.S.C. § 119(a)-(d) to and also incorporates by reference, in its entirety, European Patent Application EP 21382083.0, filed Feb. 1, 2021.

FIELD

The present disclosure refers to a random number generator comprising a vertical cavity surface emitting laser, VCSEL, according to the disclosed techniques and a method for generating random numbers using a random number generator comprising a VCSEL according to the disclosed techniques.

BACKGROUND

Vertical cavity surface emitting lasers, called VCSELs in the following, are widely known in communication technologies. VCSELs are a type of semi-conductor laser diode where the laser beam or pulse is emitted perpendicularly from one of the top surfaces. This is in contrast to usual lasering where the laser beam is emitted from an edge section of a semi-conductor laser.

In VCSELs, the laser resonator is usually provided by two distributor Bragg-reflectors parallel to a structure comprising an active region constructed from, for example, a quantum dot or a quantum well. The Bragg-reflector has layers with alternating refractive indices where these layers usually have a thickness of a quarter of the laser wavelength in the material of the reflector, thereby resulting in high-intensity reflectivity.

The VCSEL usually comprises a mode-suppressing component. This mode suppressing component is integrated into the cavity of the VCSEL or the VCSEL as such and results in only one mode of the laser beam or laser pulse being emitted from the VCSEL into the surrounding environment, i.e., outside of the VCSEL. This is done because in communication technologies, only one mode of the VCSEL is to be used and may be preferred if the intensity of the laser beam is accumulated in a single mode. This can be achieved by, for example, applying specific mode suppressing components.

VCSELs are known to work at high frequencies of 1 MHz or even more, up to several GHz, which is specifically advantageous in communication technologies, as high frequencies for transmitting information are necessary. Currently, VCSELs are used in the field of Gigabit-Ethernet and fiber channeling and provide link bandwidths from 1 GB/s to more than 400 GB/S, yielding high transmission rates.

In view of this, it is possible to create and output significant amounts of information in a short time period.

Recently, there have been developments in the field of physical random number generators that make use of physical characteristics of a system to create true random numbers. Also laser diodes have been used in this field as the qualities of an emitted laser pulse depend on the quantum physical characteristics of the laser. As these are truly unpredictable, the obtained random numbers or random sequence of bits is highly reliable and can be used, for example, in encrypting security-relevant data, computing applications or gaming.

When constructing physical random number generators, the integration levels, the quality and the speed at which operation is practical are of importance. So far, it is difficult to obtain random numbers (or entropy in general) with sufficiently high speed or at sufficiently high rates for some applications, specifically where size must be very small and the costs be kept low.

SUMMARY

In view of the above, the problem that may be solved by the disclosed techniques is to provide a random number generator that achieves high output of entropy (i.e., random numbers) per time period while, at the same time, being preferably comparatively cost-effective in production, and preferably small in size and with unique advantages in quality.

Solution

This problem may be solved by the random number generator comprising a vertical cavity surface emitting laser according to the techniques disclosed herein and the method for generating random numbers using random number generators using a vertical cavity surface emitting laser, according to the techniques disclosed herein. Further embodiments of the disclosed techniques are also provided.

The random number generator comprises a vertical cavity surface emitting laser, VCSEL, a mode separator and a photodetector and the random number generator further comprises a power source to drive the VCSEL in direct modulation mode, wherein the VCSEL is adapted to emit, from an emitting section into space outside of a VCSEL cavity, laser light with two distinct laser modes of random relative strength that can propagate in a propagation direction away from the emitting section, the mode separator is arranged in propagation direction between the photodetector and the VCSEL and the mode separator is arranged to separate the two distinct laser modes from each other and to transmit one of the distinct laser modes to the photodetector.

In the context of the present disclosure, the mode separator will be considered as any physical entity or device that is capable of separating a first mode emitted by the VCSEL from a second mode emitted by the VCSEL. For example, this can comprise a filter, a polarization filter, or the like. This specifically pertains to VCSELs that emit separated (for example, rotated about 90°, spatially separated or the like) distinct laser modes. Other ways of separating the modes, for example, separating the modes according to their frequency, are also encompassed. The disclosed techniques are not limited to a specific kind of mode separator.

The direct modulation mode comprises driving the VCSEL, alternatingly from below to above the lasering threshold, so that pulses are emitted from the VCSEL. The time duration of driving the VCSEL below the lasering threshold and above the lasering threshold is not limited according to the disclosed techniques and may be varied as required. In order to obtain a sufficient number of laser pulses for obtaining random numbers or bits, the frequency at which the VCSEL is driven above the lasering threshold, thereby emitting a laser pulse may be set above 1 Hz or 1 GHz, for example. The disclosed techniques are, however, not limited to a specific pulse frequency (number of pulses per second) and any frequency that is allowed or at which the VCSEL can work may be used.

The output power of the laser can preferably be nearly identical from one pulse to the next, but the distinct laser modes generated within the cavity have random relative strengths. By blocking one of the modes, the remaining light will also result in having random strength. This random strength can then be used to obtain a "random" bit of information from the signal detected at the photodetector. For example, if the strength of the remaining laser mode that has not been separated away by the mode separator and is thus transmitted to the photodetector has a strength that is below a detection threshold of the photodetector, no signal will be created at the photodetector and this may be later on translated into a "0" bit at this point in time. If the strength of this remaining laser mode is above a detection threshold of the photo detector, a "1" bit can be created. With this, a random sequence of bits of value "0" and "1" can be created by the random number generator according to the disclosed techniques with high efficiency while its implementation is comparatively cost-effective.

In one embodiment the random number generator further comprises a digitizer connected to the photodetector, wherein the digitizer is adapted to digitize a signal obtained from the photodetector so that, if the signal of the photodetector is above a threshold, the digitizer can output a first value and if the signal of the photodetector is below the threshold, the digitizer can output a second value that is different from the first value.

With this, the signals detected at the photodetector can be translated into digital signals that can then be further processed, for example, by subsequent computing entities for encrypting communications. The digitizer may be selected as a digitizer that can digitize signals at sufficiently high frequency so as to use the full potential of the VCSEL.

In a more specific embodiment, the digitizer is an analog-to-digital converter. Analog-to-digital converters can translate analog signals to digital signals with high efficiency and at high processing rate, which allows for driving a random number generator according to the above embodiment at high frequencies while still using all random values in the digitization process.

In a further embodiment, the VCSEL cavity does not include a mode suppressing component to suppress one of the distinct laser modes. By not providing a mode suppressing component, it is ensured that both distinct laser modes can leave the VCSEL into the space outside of the VCSEL cavity. This makes separation of these modes and use of one of the modes for creation of a signal at the photodetector possible by using the further provided mode separator.

It can also be provided that the threshold has a value corresponding to at least 90% or at least 75% or at least 50% or at least 25% of a maximum energy that can be output by the VCSEL. It is to be understood that the threshold to be used by the digitizer may be a voltage value or a current value. In this context, it is to be understood that the term that "the threshold corresponds to a percentage of a maximum energy that can be output by the VCSEL" rather refers to the voltage value or current value of the threshold corresponding to a percentage of a voltage value or a current value that would be generated by a photodetector in response to receiving a laser pulse of maximum energy that can be output by the VCSEL. With this, reliable digitization of the signals output by the photodetector can be achieved.

In a further embodiment, the VCSEL comprises, as an active medium for generating laser light, quantum dots or quantum wells.

It can also be provided that the mode separator comprises a polarization beam-splitter or a filter or a polarization-dependent optical isolator. These specific realizations of the mode separator can be implemented advantageously depending on the circumstances and the way in which the distinct laser modes are to be separated from each other. If, for example, it is more efficient to separate the modes based on their relative polarization, a grating or polarization-dependent optical isolator may be used. If the modes differ in view of the frequencies making up the modes but are not polarized relative to each other at large angles (e.g., 90°), separation based on frequencies may be more appropriate.

In a further embodiment, an optical isolator is arranged between the mode separator and the emitting section of the VCSEL and/or between the mode separator and the photodetector. Thereby, noise that could influence the signal generation and the photodetector can be suppressed.

According to the method for generating random numbers using a random number generator of the disclosed techniques, the random number generator comprises a vertical cavity surface emitting laser, VCSEL, a mode separator and a photodetector, and the random number generator further comprises a power source that drives the VCSEL in direct modulation mode, wherein the VCSEL emits, from an emitting section into space outside of a VCSEL cavity, laser light with two distinct laser modes of random relative strength that propagates in a propagation direction away from the emitting section, the mode separator is arranged in propagation direction between the photodetector and the VCSEL and the mode separator separates the two distinct laser modes from each other and transmits one of the distinct laser modes to the photodetector, wherein the photodetector outputs a signal depending on the intensity of the laser light received at the photodetector via the mode separator from the VCSEL.

This method allows for fast generation of entropy, and therefore, random numbers, while at the same time reducing the costs. In one embodiment, the random number generator further comprises a digitizer connected to the photodetector, wherein the digitizer digitizes a signal output from the photodetector so that, if the signal of the photodetector is above a threshold, the digitizer outputs a first value and if the signal of the photodetector is below the threshold, the digitizer outputs a second value that is different from the first value. Thereby, an efficient digitization of the otherwise analog signal of the photodetector is achieved.

In a further embodiment, the threshold has a value corresponding to at least 90% or at least 75% or at least 50% or at least 25% of a maximum energy that can be output by the VCSEL. With this threshold that is used by the digitizer, the reliability of the random bits generated by the digitizer may be improved.

In a further embodiment, the frequency of the direct modulation mode is adjusted by a controller or processor depending on the number of random numbers to be generated per time unit. In this context, the "number of random numbers" may be considered to be the number of random bits that are to be generated per time unit. If, for example, 40 GB of random bits are to be generated per second, the frequency of the direct modulation mode may be adjusted to be 40 GHz. As VCSELs can be used at high frequencies, almost arbitrary values regarding the frequency, at which the direct modulation mode is driven, can be used. Specifically, frequencies ranging from a plurality of Hz up to some 10

GHz are envisaged according to some embodiments of the disclosed techniques. Any frequency in between these borders can be realized and is encompassed by the disclosure.

In one embodiment, the system according to the above embodiments is implemented on a chip. With this system, the random number generator, according to the above embodiments, can be used also as an integrated circuit, for example, in computing systems, such as personal computers or smartphones.

In a further embodiment, a plurality of random number generators according to any of the above embodiments is arranged in an array, wherein the system comprises a single mode separator for all random number generators or one mode separator for each random number generator; and/or wherein the system comprises a single optical isolator for all random number generators or one optical isolator for each random number generator. This allows to increase the number of random bits that are generated per time unit while reducing the structural complexity of the multiplicity of the random number generators. Also, the costs can be reduced as a reduced number of separate components is necessary.

DETAILED DESCRIPTION

Figure 1:
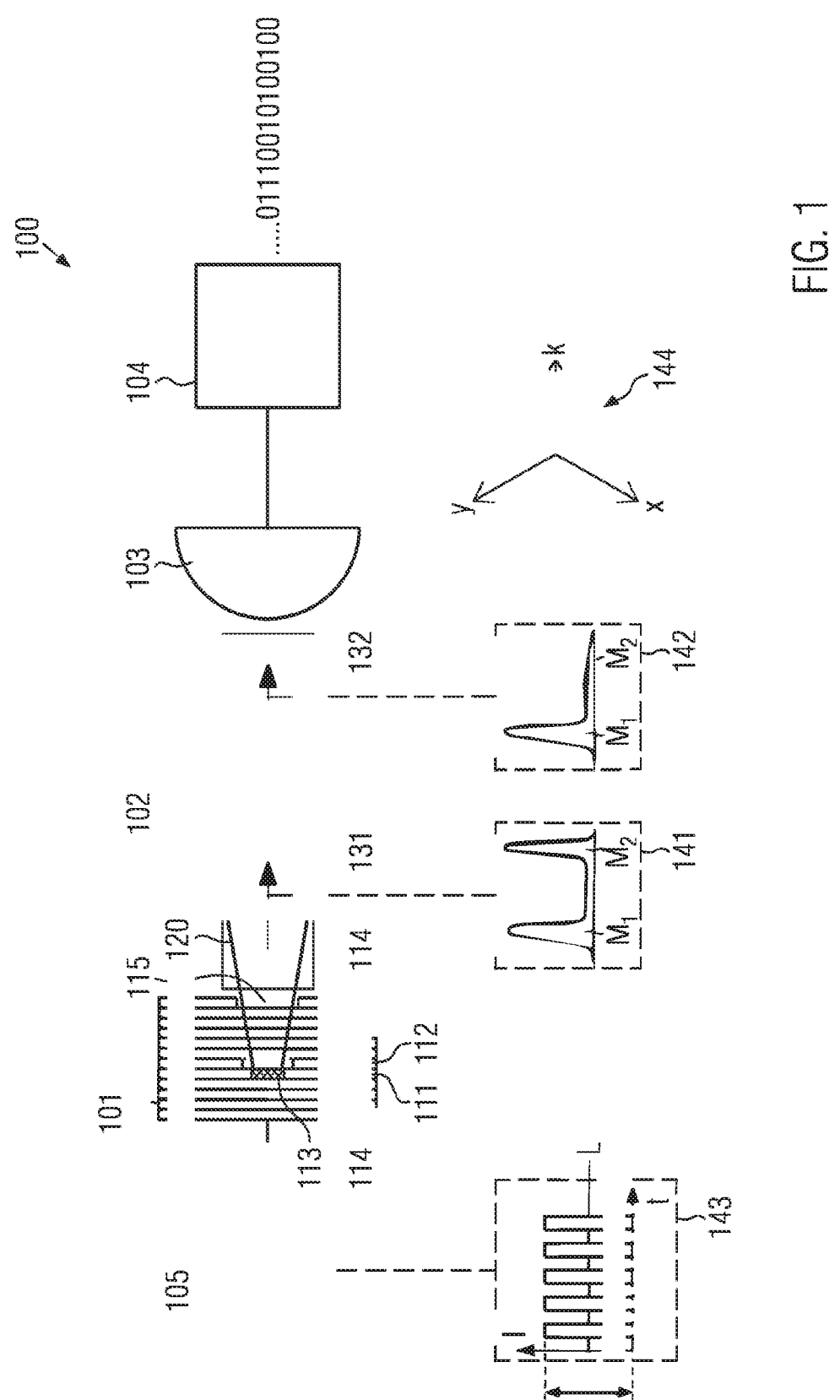
FIG. 1 shows a schematic depiction of a random number generator comprising a vertical cavity surface emitting laser according to one embodiment.

FIG. 1 shows a schematic depiction of a random number generator 100 according to one embodiment of the disclosed techniques.

In principle, the random number generator comprises four components. The random number generator 100 comprises a vertical cavity surface-emitting laser, VCSEL, 101, a mode separator 102, a photodetector 103 and a power source 105 as will be explained in further detail below.

The VCSEL 101 includes, as is known to the skilled person in the art, at least one laser cavity 111 that comprises an active region 113. On both sides (in the depiction of FIG. 1, on the left and on the right), but in any case, in planes that are parallel to the laser cavity 111, a plurality of mirrors 114 that may together realize a Bragg-reflector are arranged that allow for internal reflection of the light generated in order to finally output a laser beam.

Additionally, there can be provided a confinement structure 112, which allows focusing the laser light 120, which is emitted from the active region of the VCSEL. The VCSEL further comprises an emitting section 115 from which the laser light generated by the VCSEL actually leaves the VCSEL into outer space. The outer space may, for example, be free space or an optical isolator into which the laser light is input or any other medium like a glass fiber or a (transparent) polymer fiber or a general "optical" fiber that allows for internal propagation of an optical signal like a laser pulse through the optical fiber. In the architecture of VCSELs according to so far known technologies, there would be provided a mode suppressing component that suppresses one of the modes of laser light generated in the VCSEL and prevents it from exiting the VCSEL when the VCSEL is driven in a specific way. Specifically, this results in the whole energy output of the VCSEL being almost completely provided in one of the two modes, where this mode then leaves the VCSEL.

As it is known to the skilled person, a VCSEL creates laser light in two distinct laser modes that have random relative strength that is relative to each other but propagate into the same direction or approximately into the same direction.

By suppressing one of those modes, the emitting section 115 of the VCSEL would only emit one mode of the laser beam that comprises the full energy output of the VCSEL. It is a finding of the techniques of the present disclosure that such mode suppressing internal to the VCSEL in common place VCSELs prevents applications of these VCSELs in the field of generating random numbers.

In embodiments of the disclosed techniques, it is thus envisaged that the emitting section 115 emits laser light with two distinct laser modes M1 and M2, as depicted in the diagram 141. This is achieved by providing a VCSEL without the mode suppressing component. The modes that leave the emitting section 115 can, for example, be polarization modes, such that the first mode M1 is polarized with respect to the second mode M2, by for example, an angle of 90° or 60° or any arbitrary other angle. Alternatively or additionally, the modes M1 and M2 can comprise different frequencies or different contributions of the same frequencies or they can have a time delay or any other physical quality that allows for determining that the two modes are distinct from each other, but belong to the very same laser pulse. Due to the quantum mechanical characteristics of the VCSEL, the relative strength of the two distinct modes that leave the emitting section 115 of the VCSEL is arbitrary and thus random for each laser pulse.

It is noted that in a "perfect system" that does not show non-linear effects that influence the two modes when competing inside the VCSEL cavity, always only one of the two modes M1 and M2 will actually leave the VCSEL and carry away with it the whole energy of the laser pulse. As real VCSELS are, however, usually not free of non-linearities such as relaxation oscillations, carrier dynamics, etc., there may be some energy transfer between the two modes while competing inside the VCSEL cavity. This can result in both modes leaving the cavity where, usually, some energy is carried by one of the modes and most of the energy is carried by the other mode.

When applying mode switching to drive the VCSEL, this competition between the two modes is carried out inside the VCSEL for each laser pulse. The outcome, i.e., which of the modes will actually carry away most of the energy, is not known before the pulse is emitted and is truly random.

In view of the above, it is noted that it is a finding of the techniques of present disclosure that the competition of the modes M1 and M2 in a VCSEL leads to a physically digitized signal (in that only one mode wins and either M1 or M2 leaves the VCSEL) that, on its own already, either provides energy fully (or almost completely) in the first mode or fully (or almost completely) in the second mode. It is a finding of the techniques of the present disclosure that this can be used, in connection with a mode separator, to create random bits with a simple digitization process (as the signal is already digital or almost digital and there is no noise added by the analog to digital converter).

It is a finding of the techniques of the present disclosure that, with this arrangement, random numbers can be generated by the further techniques and procedures discussed below.

In the propagation direction of the laser pulse away from the emitting section 115 (as shown with the arrow), a mode separator 102 is arranged.

This mode separator 102 is, in its most general meaning, adapted to separate the two distinct laser modes from each other, so that after the mode separator 102, only one of the modes propagates further in the direction of the arrow towards a photodetector 103. This is shown in the diagram 142, which only comprises the laser mode M1 but no longer comprises the laser M2 or at least has suppressed significant parts of the laser mode M2. Preferably, the mode separator suppresses the propagation of the second laser mode to a degree that at least 10% or at least 45% or at least 75% or at least 90% of the energy provided by the second mode is prevented from propagating in the same direction as the first laser mode M1.

The way in which the mode separator achieves this separation of the laser modes M1 and M2 from each other is not limited and can be done in any suitable way. Of course, the way in which the mode separator 102 can actually act upon the laser modes M1 and M2, which arrive at the mode separator 102 after having left the emitting section 115 depends on the physical characteristics and differences of the distinct laser modes M1 and M2.

In one embodiment, the distinct laser modes are differently polarized along different axes. For example, they could be polarized, such that one of the distinct laser modes is polarized into the x-direction, whereas the other laser mode is polarized into the y-direction.

This is indicated with the coordinated diagram 144. The propagation direction of the laser pulse is indicated with the k-direction and the polarization axes X and Y are in a plane perpendicular to the propagation direction K.

In order to explain more easily, assume that the first mode M1 is polarized, for example with respect to its electrical field components, along the x-direction, whereas the other mode M2 is polarized, for example with respect to its electrical field components, along the y-direction. In such a case, an appropriate mode separator 102 may be a filter or grating, which is arranged so that the mode M1 can pass the filter, whereas the mode M2 cannot pass the filter. In such a case, as the angle between the polarization directions of the first mode M1 and the second mode M2 is the mode separator 102 will be able to (almost) completely eliminate the second mode M2 or prevent it from passing through the mode separator, whereas the first mode M1 can pass the mode separator 102 (almost) at its original strength.

Other realizations of the mode separator can be thought of as well.

Specifically, the mode separator can be realized as a polarization beam splitter, such that even though the first mode M1 and the second mode M2 are separated from each other, none of them is actually suppressed. This allows for redirecting the second mode M2 into another propagation direction. Alternatively, also a polarization-dependent optical isolator can be used that allows the first mode M1 to pass through the polarization-dependent optical isolator, whereas the second mode M2 is not allowed to pass through the polarization dependent optical isolator.

However, the disclosed techniques are not limited with regard to how the mode separator is actually realized and any realization that allows for separating the distinct laser modes M1 and M2 from each other can be thought of. Preferably, the separation is complete or almost complete in the sense that one of the modes is completely separated away from the other mode.

In the propagation direction of the laser light after the mode separator 102, a photodetector 103 is arranged. It is intended that irrespective of the realization of the mode separator 102, only one of the modes M1 or M2, depending on how the mode separator 102 actually separates the modes, is transmitted in the direction of the photodetector 103 and actually hits the photodetector 103.

In more realistic cases, it may still be that the mode separator does not perfectly separate the modes M1 and M2 from each other. Even in such a case, the mode separator (for example a filter) will result in the modes M1 and M2 having, in any case, distinguishable strengths. Thus, even in cases where the mode separation is not perfect, it will be possible to distinguish the one mode from the other after they have passed the mode separator.

Furthermore, as explained above, in many cases, the energy of the laser pulse will be carried away almost completely by one of the modes M1 or M2. Even if the mode separator does not perfectly separate the modes, there is, in some embodiments, only a detectable signal at the photodetector if the mode that is allowed to pass the mode separator 102 carries most of the energy of the pulse. Correspondingly, there will be no signal if the mode that is intended to be separated away by the mode separator 102 so as to not hit the photodetector carries most of the energy of the pulse. This natural digitization already explained above can be properly used together with the mode separator to actually produce random bits (i.e., for example a 1 if the mode carrying most of the pulse energy passes the mode separator and a 0 if the mode carrying most of the energy of the pulse does not pass the mode separator). This is because the mode being separated away by the mode separator will not produce a detectable signal at the photodetector (even if not perfectly filtered or separated) whereas the mode passing the mode separator, when carrying a significant portion of the pulse's energy, will cause a signal at the photodetector. This will be the case even if the mode separator works not perfect, i.e., separates only one of the modes without influencing the other and separating the mode completely.

With this arrangement and due to the fact that the relative strength of the first mode and the second mode M1 and M2 of a respective laser pulse emitted from the VCSEL is governed by the law of quantum mechanics, and therefore, truly random, the strength of the mode arriving at the photodetector cannot be predicted and is thus truly random. This results in the photodetector arbitrarily detecting a photo signal depending on the strength of the mode actually impinging on the photodetector.

This allows for generating random numbers by using the output of the photodetector as an indication of the randomly obtained mode M1.

However, for some implementations, it may be preferred to obtain a sequence or stream of bits (0s and 1s) that is random. This can make further processing of the random values produced by the random number generator more convenient in case of application of the random numbers in computing environments.

In view of this, the random number generator may further comprise a digitizer 104 that is connected to the photodetector 103. This digitizer 104 can be adapted to digitize the signal obtained from the photodetector and can, for example, be implemented as an analog to digital converter.

The signal output by the photodetector and obtained by the digitizer will usually or generally be a current signal or a voltage signal that can take any value between a minimum value that corresponds to the noise of the photodetector and a maximum value that at least corresponds to the maximum energy output of the VCSEL per pulse. In order to digitize these signals, it can be provided that the digitizer is adapted to compare the signal obtained from the photodetector (for example, a voltage signal or a current signal) to a reference signal. If the signal obtained from the photodetector is above this reference signal, the output of the digitizer can be 1. If the signal of the photodetector is below this reference signal, the output of the digitizer can be 0. It can of course also be the other way around.

Thereby, the digitizer 104 unit performs the digitization of the signal obtained from the photodetector by a comparison operation. One embodiment of the digitizer can be an analog-to-digital converter because these converters are cost-efficient and can perform the transformation of analog signals (such as the current signal obtained from the photodetector) into digital values (0s and 1s) at high frequency. Thereby, it can be ensured that all entropy (i.e., each and every value output by the photodetector) can be translated into a digital value. The reference signal provided to or used by the digitizer may be referred to as a threshold or threshold signal. This can, basically, have any value. However, in some embodiments, the threshold is set based on the energy the VCSEL outputs per laser pulse.

For example, for a first laser pulse, 50% of the overall energy output may be provided in the first mode M1 and another 50% may be provided in the second mode M2. When assuming that the mode separator 102 perfectly separates the first mode M1 from the second mode M2 and only the first mode is allowed to propagate further in the direction of the photodetector 103, the mode M1 with an energy that equals 50% of the overall output of the VCSEL hits the photodetector 103 and can generate a signal there. This signal can be translated into electrical current and is then provided to the digitizer where it is compared to the reference signal, in some embodiments, in order to digitize the signal. When considering a second laser pulse, in which more than 50%, for example, 90% of the overall energy output of the VCSEL is provided within the second mode M2 and only 10% of the energy is provided in the first mode M1, the mode separator will nevertheless separate the second mode M2 from the first mode M1, such that only 10% of the overall output of the energy of the VCSEL is provided in the first mode M1 and hits the photodetector 103. This signal will then likewise be translated into an electrical signal (like a current signal) by the photodetector 103 and provided to the digitizer for digitization. Preferably, the digitizer allows for digitizing the signal reaching the photodetector so that signals that indicate that most of the energy is carried by one of the modes result in digitization of the signal obtained at the photodetector to either be 1 or 0, depending on which mode carries more energy.

It is a finding of the techniques of the present disclosure (see above) that, in most cases, almost all energy of the laser pulse will be carried by one of the two modes. This can advantageously be used in selecting a threshold value for the digitizer. Therefore, by setting the reference signal to a value (referred to also as threshold) that corresponds to at least 25% or at least 50% or at least 75% or even 90% of the maximum energy output by the VCSEL per pulse, digitization in a way that only signals of the photodetector 103 that indicate that the mode passing the mode separator 102 carries almost the full energy of the pulse emitted by the VCSEL are counted as a first digital value (for example 1) and all signals below that threshold are determined as a second digital value (for example 0). Usually, the photodetector will not only receive the mode M1 with arbitrary strength, but will also receive other signals from the surrounding environment even if the photodetector would be isolated together with the VCSEL and the mode separator. This comes, for example, from thermal fluctuations and the like and is known as "noise" or "untrusted signals" in the sense of generating random numbers from a trusted process (as the VCSEL effect described in this disclosure).

However, the disclosed techniques are not limited to the above exemplary values for the threshold and also other values can be chosen. The threshold can correspond, for example, to exactly 90% of the maximum energy that can be output by the VCSEL or 95%, thereby making sure that signals are only generated in case the mode M1 carries almost all of the energy output by the VCSEL for the laser parts. Specifically, as the energy distribution in one of the modes is usually close to 100% (meaning in most pulses the energy is almost completely provided in the one or the other mode) using a high threshold can be advantageous in some implementations.

In order to drive the VCSEL 101 to produce laser pulses, the random number generator 100 may further comprise a power source 105 for driving the VCSEL in direct modulation mode. For driving the VCSEL at this direct modulation mode, the power source 105 may be adapted to produce a current signal, as indicated in the depiction 143 in FIG. 1, wherein the current I varies between a maximum value I1 and a minimum value I2, wherein I1 is above the lasering threshold indicated with L in the depiction 143 and I2 is below the lasering threshold of the VCSEL, such that time periods of lasering are alternating with the time periods of non-lasering.

The power source 105 is preferably adapted to vary the frequency, at which the VCSEL is driven with the direct modulation mode. For example, the power source may be adapted to vary the frequency at which the lasering threshold is reached from below 10 Hz up to several 10 or several hundred of GHz. Depending on what is required, this may allow for creating an arbitrary number of random numbers or a random sequence of bits. Further, there is not more entropy generated than necessary, thereby reducing the stress to the VCSEL.

In FIG. 1, there are further components 131 and 132. The components 131 and 132 are merely optional and show optical isolators. The optical isolator 131 is placed between the emitting section 115 of the VCSEL and the mode separator 102, and lies within the region of propagation of the laser parts 120.

The optical isolator 131 allows for preventing scattered light from the outside to enter the system and can increase the efficiency and reliability with which the random numbers can be generated. Specifically, the noise to the random signal, which is obtained at the photodetector can be reduced by applying such an optical isolator 131.

As depicted in FIG. 1, it is not necessarily the case that an optical isolator is placed between the emitting section 115 and the mode separator 102, but an optical isolator 132 may also or alternatively be placed between the mode separator 102 and the photodetector 103. As the mode separator preferably does not allow scattered light to pass but only allows one of the modes to pass the mode separator 102, the amount of noise is already reduced at this point. Further noise may thus only need to be reduced between the mode separator 102 and the photodetector 103.

The system of FIG. 1 was so far described as comprising specific components without going into further detail regarding their dimensions or their actual arrangement.

Preferably, the random number generator 100 is provided integrated into a chip, which means that the VCSEL and the other components, specifically the photodetector and the digitizer as well as the power source are arranged on a chip and preferably miniaturized to dimensions below 1 cm. However, the disclosed techniques are not limited to such dimensions and also larger realizations in the order of the plurality of centimeters for the whole system may be thought of.

One advantage of the embodiments of the disclosed techniques is that the frequency at which random bits of random signals (emitted from the photodetector) can be generated can be adjusted almost arbitrarily over a large frequency range. However, some applications may require even more random numbers being generated per time unit.

In such a case, it is not possible to use the second mode that is separated by the mode separator and could, in principle, be propagated to a second photodetector because this mode would only represent redundant information. This is because when having detected the first mode, the second mode does not provide any further entropy. While the second mode M2, which is separated by the mode separator 102, if not completely eliminated, can be used as a control signal, it does not provide further randomness, and therefore does not constitute real entropy. Nevertheless, in some implementations, also the second mode may be detected using, for example, a second photodetector and optionally also a further digitizer associated with this photodetector. This can be advantageous in evaluating the reliability of the random values obtained by the digitizer. For example, a determination may be made whether the second mode indeed carried less than 50% of the energy of the pulse. It can be provided that a bit generated by the digitizer 104 is only used further or is only output in case the sum of the value of this bit and a value of a bit generated by a digitizer digitizing the signal of the second mode equals 1.

Figure 2A:
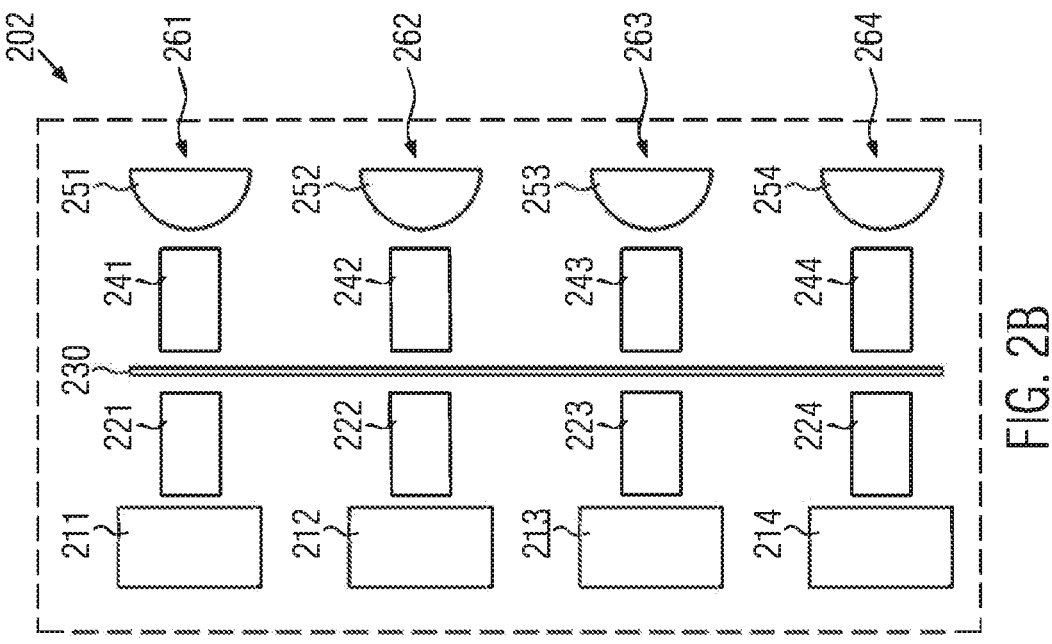
FIGS. 2A to 2C show different embodiments of systems comprising a plurality of random number generators according to different embodiments.
Figure 2B:
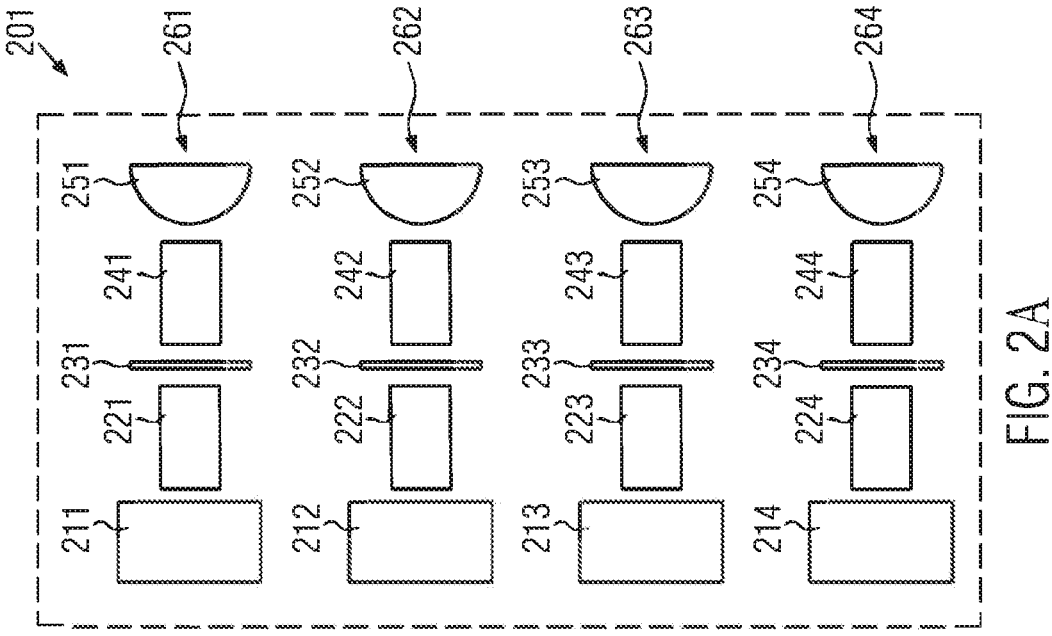
Figure 2C:
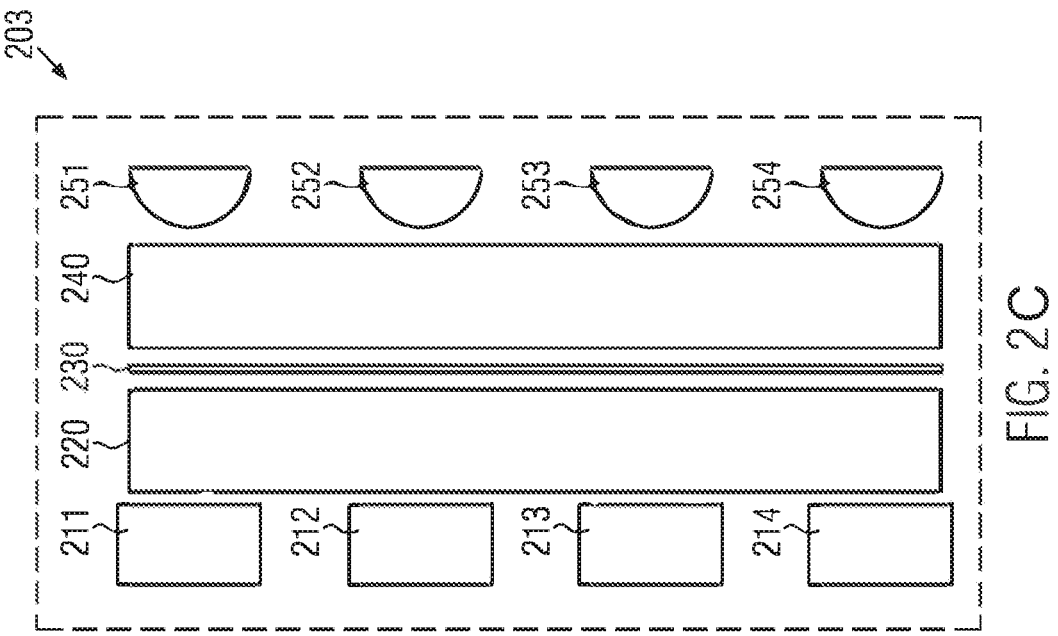

In order to increase the rate at which random numbers can be generated using a VCSEL and a mode separator as well as a photodetector, the FIGS. 2A to 2C depict integrated solutions, in which a system comprising a plurality of random number generators is shown.

In the embodiment of FIG. 2A, the system 201 comprises four random number generators 261 to 264.

In order to truly generate random numbers with each of these random number generators, each of the random number generators comprises an isolated or separate VCSEL 211 to 214, which only creates laser beams or laser pulses for the specific random number generator. Furthermore, each of the random number generators comprises its own photodetector 251 to 254.

Though not depicted here, it is possible that in some embodiments, all the random number generators share a single power source that is connected to each of the random number generators, so that all the random number generators receive the same current signal at the same time and at the same frequency, thereby resulting in synchronized generation of laser pulses. Instead of providing the same current signal, some embodiments comprise tuning the current signal provided to specific VCSELs. For example, the current (i.e., the amount of current) provided to a specific VCSEL among the plurality of VCSELs may be adjusted while maintaining the timing and frequency relation for when the current signal is issued the same. Thereby, all VCSELs are provided with current signals at the same time and at the same frequency while for at least one of the VCSELs the current actually provided may be different from the current provided to other VCSELs. This also encompasses that the current provided to each VCSEL is different from the current provided to each other VCSEL. Furthermore, in some embodiments, the current or current signal provided to the VCSELs may be adjustable for a group of pulses or even a single pulse independent from the current signal provided to other VCSELs.

This does not prevent the generation of random numbers, as the relative strength between the first mode and the second mode output by the respective VCSEL of the respective random number generator is completely arbitrary, the relative strength of the modes of a laser pulse output by the VCSEL 211 will in almost every case be different from the relative strength of modes of the laser pulse output at the same time, but with the VCSEL 212. Correspondingly, the signals detected at the photodetectors 251 to 254 will usually differ from each other.

As shown in the embodiment of FIG. 2A, each of the random number generators comprises its own mode separator 231 to 234 and optionally corresponding optical isolators 221 to 224 and/or 241 to 244. The distinct random number generators can be integrated on a single chip and it can be provided that there is one digitizer for each of the random number generators in order to allow reliable digitization of the respective signals. However, it can also be provided that a single digitizer is provided for all random number generators. In case only a single digitizer is provided, it may be preferred to first aggregate the output of all photodetectors and provide the aggregated output to the digitizer. If the VCSELs are driven at different frequencies or timing so that they do not emit pulses at the same time, aggregation of the output of the photodetectors may not be necessary and each photodetector may be connected to the input port of the digitizer. Only one signal from only one photodetector will arrive at the digitizer at a given time, thereby ensuring clear signal separation. As the digitizer does not need to be aware of or know which of the photodetectors actually provided the signal, this can be a cost efficient implementation without adversely affecting the generation of random numbers.

Although FIG. 2A as well as FIGS. 2B and 2C show four random number generators, the embodiment is not restricted in this regard and also any other arbitrary number of random number generators may be provided. In this sense, there may be provided an array of VCSELs (together with associated components like optical isolator, mode separator and photodetectors) of, for example, up to 20, or up to 50 or up to 100 VCSELs per array. In the embodiment of FIG. 2B, the system 202 comprises four random number generators 261 to 264. While their structure is, in principle, identical to the one described in relation to FIG. 2A, this embodiment comprises a single mode separator 230 for all random number generators. For example, this mode separator can be realized by a grating or a filter or a polarization-dependent optical isolator that extends over the regions in which the laser pulses of the VCSELs of all random number generators travel in the direction of the respective photodetectors 251 to 254.

This reduces the number of individual components that need to be employed and can facilitate the integration of the system.

In the embodiment of FIG. 2C, this is provided to an even further extent by providing, in addition to the single mode separator 230, also the optical isolator 220 and/or the optical isolator 240 as a single optical isolator 220 or 240 for all the random number generators together. Thereby, the number of separate and independent components that require adjustment and arrangement relative to the other components is reduced even further.

Some embodiments comprise that instead of the photo-detectors 251 to 254 only a single photodetector is provided for all VCSELs or at least a group of VCSELs comprising more than one VCSEL but less than the whole number of VCSELs.

The signals output by the VCSELs can, for example with the aid of the mode separator(s), be guided to the single photodetector for detection.

This embodiment may be specifically advantageous if the VCSELs are driven at the same frequency but with a small time delay so that no signals of different VCSELs are emitted at the same time and separation of the isolated signals is possible at the photodetector and/or the associated digitizer.

In embodiments with a single photodetector for multiple VCSELs or even in other embodiments mentioned herein (specifically where a plurality of photodetectors is provided), there may also be provided a multibit-digitizer, preferably a multibit-analog-to-digital converter for converting the signal(s) received from the photodetector(s).

What is claimed is:

1. A random number generator comprising:
a vertical cavity surface emitting laser (VCSEL);
a mode separator;
a photodetector; and
a power source to drive the VCSEL in direct modulation mode,
wherein the VCSEL is configured to emit, from an emitting section into space outside of a VCSEL cavity, laser light with two distinct laser modes of random relative strength that can propagate in a propagation direction away from the emitting section,
wherein the mode separator is arranged between the photodetector and the VCSEL in the propagation direction, and
wherein the mode separator is arranged to separate the two distinct laser modes from each other and to transmit one of the two distinct laser modes to the photodetector.

2. The random number generator according to claim 1, wherein the random number generator further comprises a digitizer connected to the photodetector, wherein the digitizer is configured to digitize a signal obtained from the photodetector so that, when the signal of the photodetector is above a threshold, the digitizer outputs a first value and when the signal of the photodetector is below the threshold, the digitizer outputs a second value that is different from the first value.

3. The random number generator according to claim 2, wherein the digitizer comprises an analog-to-digital converter.

4. The random number generator according to claim 1, wherein the VCSEL cavity does not comprise a mode suppressing component to suppress one of the two distinct laser modes.

5. The random number generator according to claim 2, wherein the threshold has a value corresponding to at least 90% of a maximum energy that can be output by the VCSEL.

6. The random number generator according to claim 2, wherein the threshold has a value corresponding to at least 75% of a maximum energy that can be output by the VCSEL.

7. The random number generator according to claim 2, wherein the threshold has a value corresponding to at least 50% of a maximum energy that can be output by the VCSEL.

8. The random number generator according to claim 2, wherein the threshold has a value corresponding to at least 20% of a maximum energy that can be output by the VCSEL.

9. The random number generator according to claim 1, wherein the VCSEL comprises, as an active medium for generating laser light, quantum dots or quantum wells.

10. The random number generator according to claim 1, wherein the mode separator comprises a polarization beam-splitter, a filter or a polarization-dependent optical isolator.

11. The random number generator according to claim 1, wherein an optical isolator is arranged between the mode separator and the emitting section of the VCSEL and/or between the mode separator and the photodetector.

12. A method for generating random numbers using a random number generator comprising:
providing a vertical cavity surface emitting laser (VC-SEL), a mode separator and a photodetector, a power source that drives the VCSEL in direct modulation mode;
driving the VCSEL via the power source such that the VCSEL emits, from an emitting section into space outside of a VCSEL cavity, laser light with two distinct laser modes of random relative strength that propagates in a propagation direction away from the emitting section;
separating the laser light via the mode separator such that the mode separator transmits one of the two distinct laser modes to the photodetector; and
obtaining, from the photodetector, a signal depending on an intensity of the laser light received at the photode-tector via the mode separator from the VCSEL.

13. The method according to claim 12, wherein the random number generator further comprises a digitizer connected to the photodetector, the method further comprises digitizing, via the digitizer, the signal obtained from the photodetector such that when the signal of the photode-tector is above a threshold, the digitizer outputs a first value, and such that when the signal of the photodetector is below the threshold, the digitizer outputs a second value that is different from the first value.

14. The method according to claim 13, wherein the threshold has a value corresponding to at least 90% of a maximum energy that is output by the VCSEL.

15. The method according to claim 13, wherein the threshold has a value corresponding to at least 75% of a maximum energy that is output by the VCSEL.

16. The method according to claim 13, wherein the threshold has a value corresponding to at least 50% of a maximum energy that is output by the VCSEL.

17. The method according to claim 13, wherein the threshold has a value corresponding to at least 29% of a maximum energy that is output by the VCSEL.

18. The method according to claim 12, further comprising adjusting, via a controller, a frequency of the direct modu-lation mode depending on a number of random numbers to be generated per time unit.

* * * * *